(12) United States Patent
Gupta et al.

(10) Patent No.: US 11,004,503 B1
(45) Date of Patent: May 11, 2021

(54) WRITE ASSIST CIRCUITRY

(71) Applicant: Arm Limited, Cambridge (GB)

(72) Inventors: Lalit Gupta, Cupertino, CA (US); El Mehdi Boujamaa, Valbonne (FR); Nicolaas Klarinus Johannes Van Winkelhoff, Roquefort-les-pins (FR); Bo Zheng, Cupertino, CA (US); Fakhruddin Ali Bohra, San Jose, CA (US); Nimish Sharma, Jalandhar (IN); Hetansh Pareshbhai Shah, Ahmedabad (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/698,866

(22) Filed: Nov. 27, 2019

(51) Int. Cl.
*G11C 11/419* (2006.01)
*G11C 11/16* (2006.01)
*G11C 11/418* (2006.01)

(52) U.S. Cl.
CPC ........ *G11C 11/419* (2013.01); *G11C 11/1653* (2013.01); *G11C 11/1673* (2013.01); *G11C 11/1675* (2013.01); *G11C 11/418* (2013.01)

(58) Field of Classification Search
None
See application file for complete search history.

(56) References Cited

U.S. PATENT DOCUMENTS

| 5,646,885 A * | 7/1997 | Matsuo ................ G11C 11/412 365/154 |
| 2014/0071737 A1 * | 3/2014 | Sharma ................ G11C 11/412 365/156 |

* cited by examiner

*Primary Examiner* — James G Norman
(74) *Attorney, Agent, or Firm* — Pramudji Law Group PLLC; Ari Pramudji (57) ABSTRACT

Various implementations described herein are directed to a device having memory circuitry with a core array of bitcells. The device may include write assist circuitry having passgates coupled to the bitcells via bitlines. The passgates may include a first passgate coupled to the bitcells via a first bitline and a second passgate coupled to the bitcells via a second bitline, and a gate of the second passgate may be coupled to the first bitline.

13 Claims, 12 Drawing Sheets

WRITE ASSIST CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Memory compilers utilize configuration data to generate physical layout designs of memory circuitry for read and write access operations. Traditional memory compilers examine characterized data to develop various memory instances that cover the memory compiler space. However, some traditional techniques typically introduce accuracy errors in reference to memory instance data. In some cases, various leakage, timing, power and noise data for the memory instances is stored, and some traditional memory compilers typically analyze error prone memory instances related to entire memory circuits, gather results, and then compute a final result. These accuracy errors often effect reliability of memory instances. Thus, traditional layout techniques can be inefficient, time-consuming and unreliable, and traditional layout techniques can cause accuracy errors due to some memory instances having sensitivity to a number of rows (e.g., bitcells, columns, and/or wordline drivers). As such, there exists a need to improve physical design implementation of memory circuits to provide for more reliable read and write access operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to write assist schemes and techniques that may improve read and write operations in physical layout design of memory architecture. For instance, various schemes and techniques described herein may provide for a system or device having a single port memory architecture that supports dual wordline circuitry. In some instances, the access schemes and techniques described herein may be configured to provide write assist circuitry for dual y-mux memory with no impact on read operations, and the write assist circuitry may have optimized area, e.g., with no need to duplicate column multiplexers on upper and lower bitcell arrays. Also, the write assist circuitry may improve the reliability of memory while writing actual bitcells and with no impact on reference bitcells. The memory architecture may refer to static random access memory (SRAM) or magneto-resistive random access memory (MRAM). The memory architecture may include memory circuitry having a core array of bitcells that are accessible via bitlines. In SRAM, bitlines may refer to complementary bitlines (BL, NBL), and in MRAM, bitlines may refer to a bitline (BL) and a source line (SL).

Various implementations of read and write access schemes and techniques will be described in detail herein with reference to FIGS. 1A-5B.

Figure 1A:
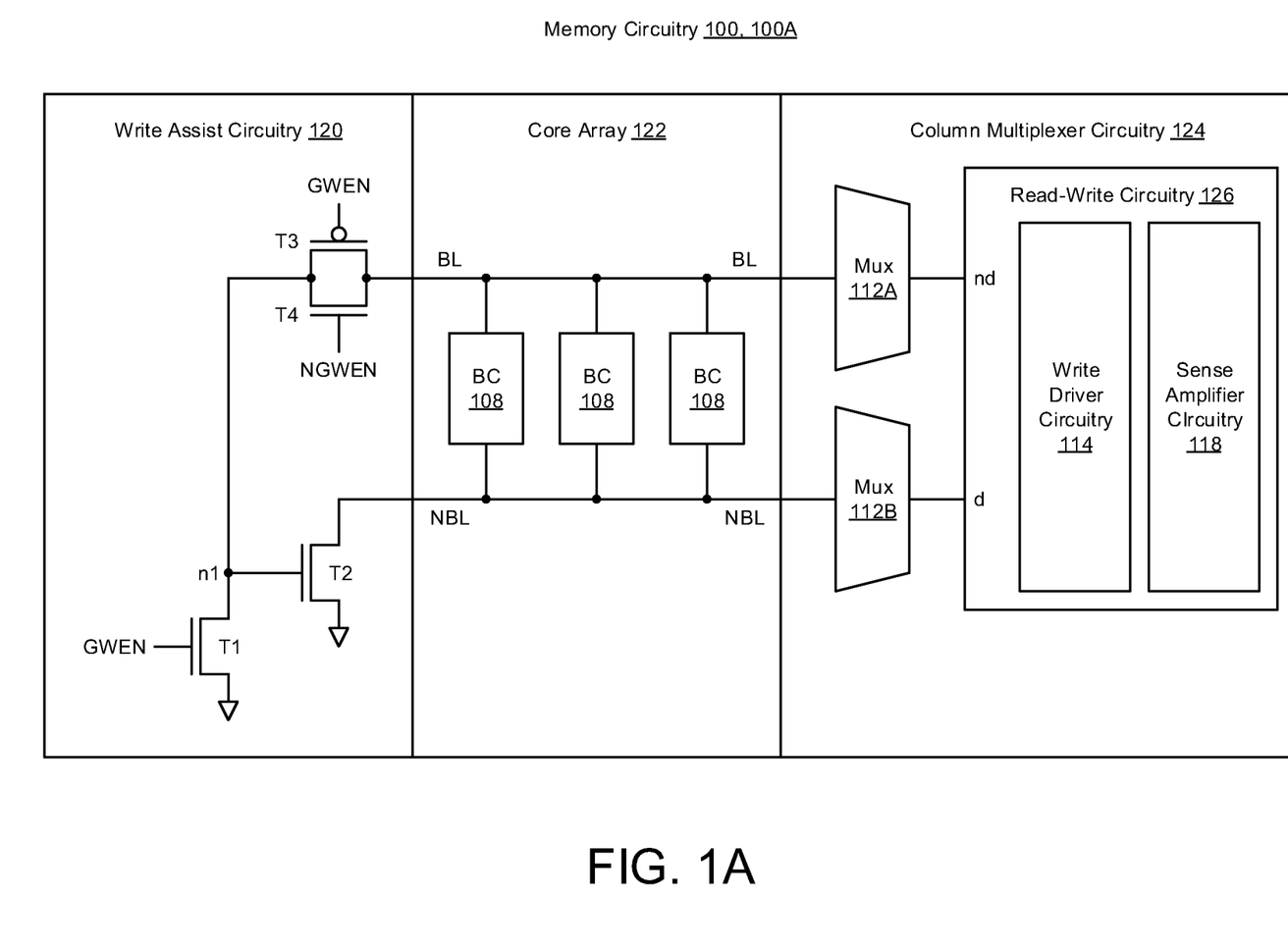
FIGS. 1A-1D illustrate memory circuitry that uses write assist schemes and techniques in accordance with various implementations described herein.
Figure 1B:
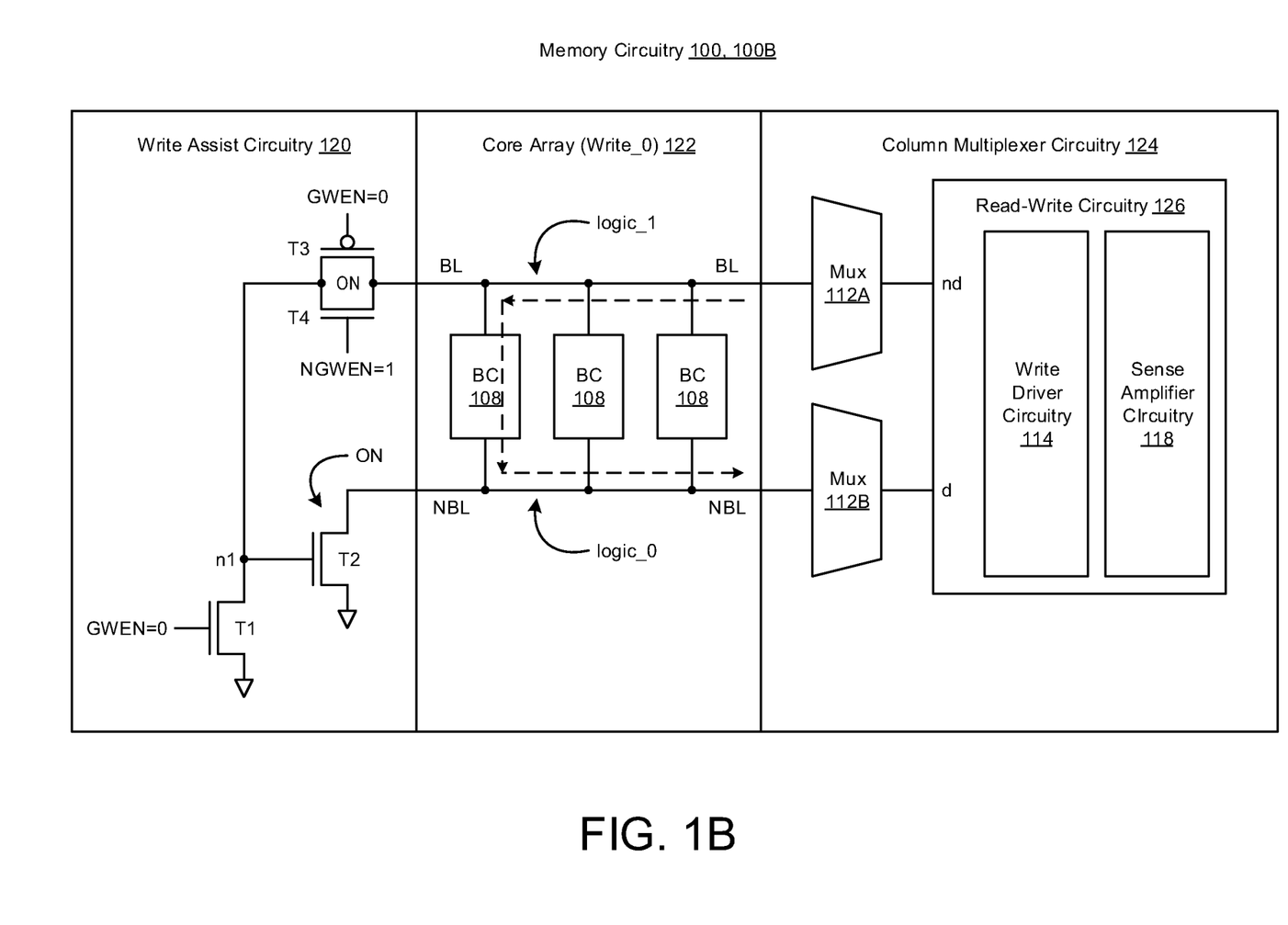
Figure 1C:
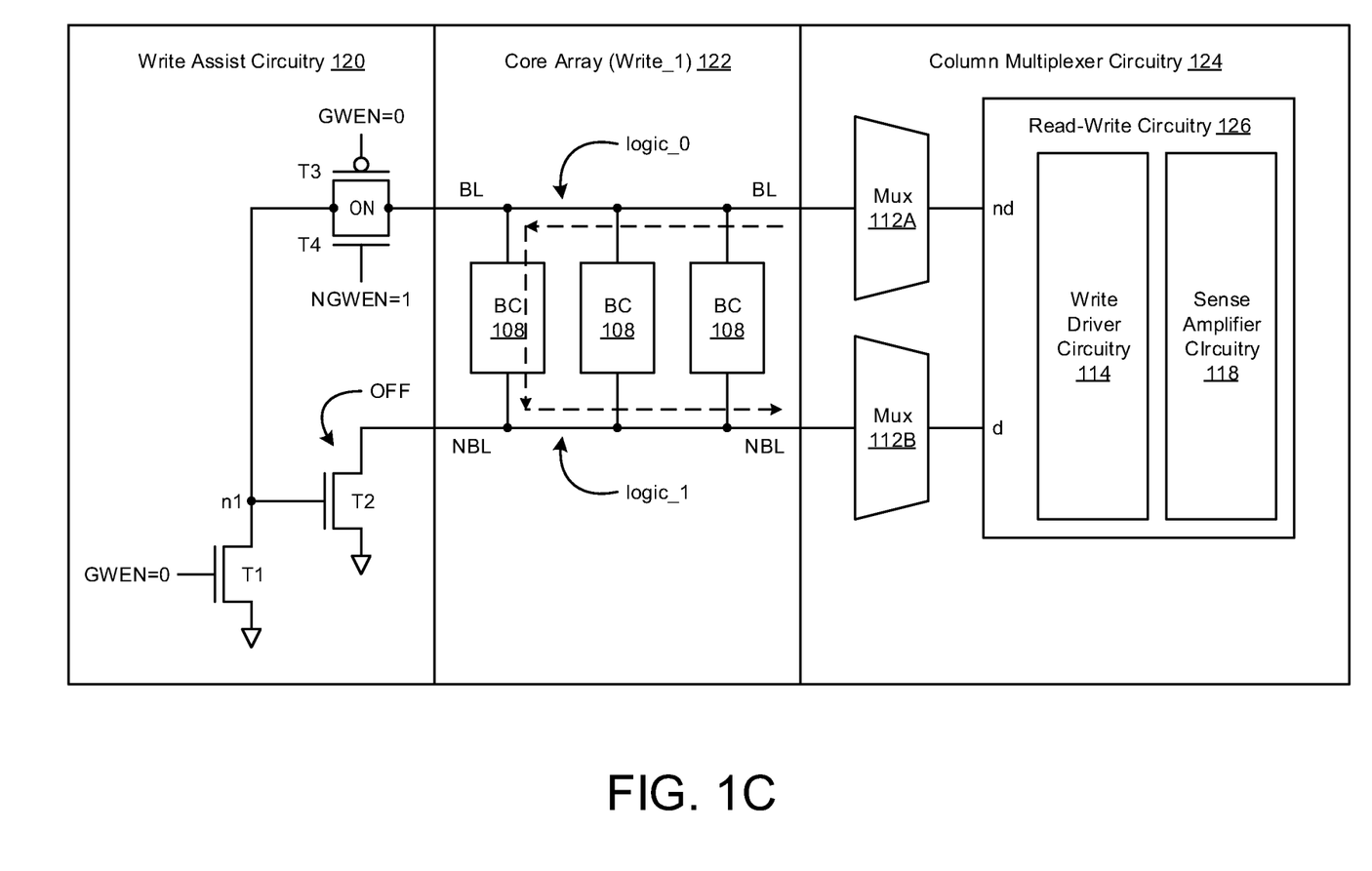
Figure 1D:
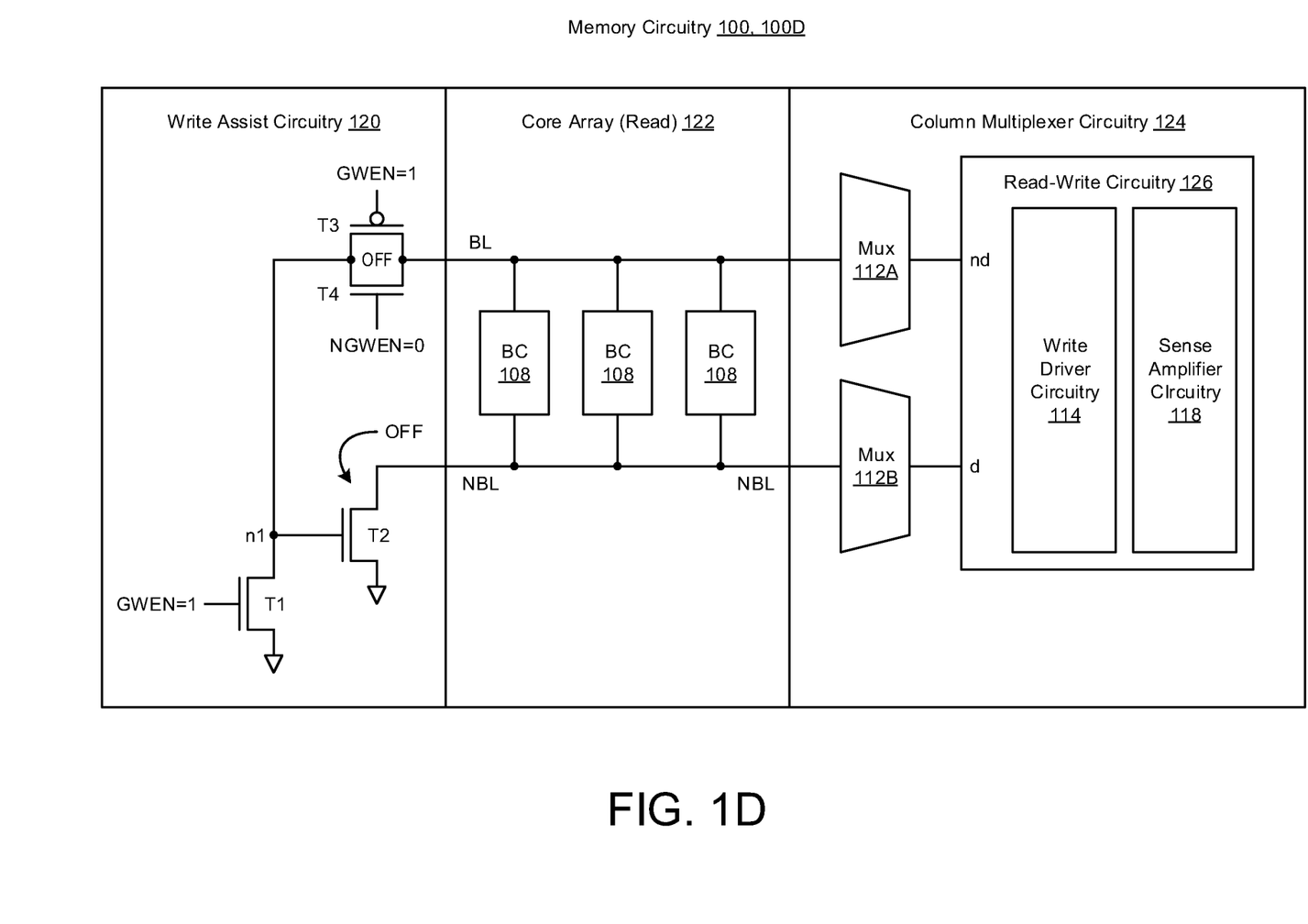

FIGS. 1A-1D illustrate memory circuitry 100 that utilizes write assist schemes and techniques in accordance with some implementations described herein. In particular, FIG. 1A shows a configurational diagram 100A of the memory circuitry 100, FIG. 1B shows a write_0 operational diagram 100B of the memory circuitry 100, FIG. 1C shows a write_1 operational diagram 100C of the memory circuitry 100, and FIG. 1D shows a read operational diagram 100D of the memory circuitry 100.

In some instances, the memory circuitry 100 may be implemented as a system or device having various circuit components that are arranged and/or coupled together as an assemblage or some combination of parts that provide for a physical layout design and related structures. Also, in some instances, a method of designing, providing and building the memory circuitry 100 may involve use of various circuit components described herein so as to implement write assist schemes and techniques associated therewith.

As shown in FIG. 1A, the memory circuitry 100 may include various circuitry, such as, e.g., write assist circuitry 120, a core array 122 of bitcells (BC) 108, and column multiplexer circuitry 124. In some instances, the write assist circuitry 120 may include various circuit components, such as, e.g., multiple passgates T1-T4, that are coupled to one or more bitlines (BL, NBL). Also, in some instances, the column multiplexer circuitry 124 may include various circuit components, such as, e.g., multiplexers 112A, 112B and read-write circuitry 126, that are coupled to the bitlines (BL, NBL). The read-write circuitry 126 may include write driver circuitry 114 and sense amplifier circuitry 118.

The memory circuitry 100 may be implemented with one or more core arrays 122 in various multi-bank configurations, wherein each bank has an array of memory cells or bitcells. Each bitcell may be configured to store at least one data bit value (e.g., data value related to a logical '0' or '1'). The one or more core arrays 108 include any number of bitcells arranged in various configurations, such as, e.g., two-dimensional (2D) memory arrays having any number of columns and any number of rows of multiple bitcells, which may be arranged in a 2D grid pattern for read and write memory access. Each bitcell may be implemented with any type of memory, including, e.g., static random access memory (SRAM), magneto-resistive RAM (MRAM), and/or any other type of similar memory. Also, each bitcell may include a multi-transistor static RAM (SRAM) cell, including various types of SRAM cells, such as, e.g., any type of complementary MOS (CMOS) SRAM cells, such as, e.g., 4T, 6T, 8T, 10T, or more transistors per bit. In other instances, each bitcell may include a multi-layer MRAM bitcell having free-layers and pinned layers. In SRAM, the bitlines may refer to complementary bitlines (BL, NBL), and in MRAM, the bitlines may refer to a bitline (BL) and a source line (SL).

The write assist circuitry 120 may include the passgates T1, T2, T3, T4 that are coupled to the bitcells 108 via the bitlines (BL, NBL). The passgates may include a first passgate T1 coupled to the bitcells 108 via a first bitline BL and a second passgate T2 coupled to the bitcells 108 via a second bitline NBL. In some instances, a gate of the first passgate T1 may receive a global write enable (GWEN) signal or a write controlled clock, and a gate of the second passgate T2 may be coupled to the first bitline BL. The first passgate T1 may be a first N-type transistor, and the second passgate T2 may be a second N-type transistor. However, in other configurations, the first passgate T1 and/or the second passgate T2 may be implemented with a P-type transistor.

The write assist circuitry 120 may include at least one transmission gate (T3, T4) that is coupled to the first bitline BL between the first passgate T1 and the bitcells 108 in the core array 122, and the gate of the second passgate T2 may be coupled between the transmission gate (T3, T4) and the first passgate T1. The transmission gate (T3, T4) may include a third passgate T3 (e.g., a P-type transistor) and a fourth transistor T4 (e.g., an N-type transistor). In some instances, a gate of the third passgate T3 may receive a first global write enable signal (e.g., GWEN), and a gate of the fourth passgate T4 may receive a second global write enable signal (e.g., NGWEN) that is complementary to the first global write enable signal (e.g., GWEN). The third passgate T3 may be a P-type transistor, and the fourth passgate T4 may be a third N-type transistor. However, in other configurations, the third passgate T3 may be implemented with an N-type transistor, and the fourth passgate T4 may be implemented with an N-type transistor.

The column multiplexer circuitry 124 may include the multiplexers (Mux) 112A, 112B and the read-write circuitry 126 having the write driver circuitry 114 and the sense amplifier circuitry 118 that are coupled to the bitlines (BL, NBL). The multiplexers (Mux) 112A, 112B may include a first multiplexer (Mux) 112A that is coupled to the bitcells 108 via the first bitline BL between the bitcells 108 and a first data input (d) of the read-write circuitry 126. The multiplexers (Mux) 112A, 112B may include a second multiplexer (Mux) 112B that is coupled to the bitcells 108 via the second bitline NBL between the bitcells 108 and a second data input (nd) of the read-write circuitry 126.

The memory circuitry 100 may be implemented as an integrated circuit (IC) in various types of memory, such as, e.g., random access memory (RAM), including static RAM (SRAM), magneto-resistive RAM (MRAM), and/or any similar memory. The memory circuitry 100 may also be implemented as an IC with single-port memory architecture and related circuitry. The memory circuitry 100 may also be integrated with computing circuitry and related components on a single chip. The memory circuitry 100 may be implemented in various embedded systems for various electronic, mobile and Internet-of-things (IoT) applications, including low power sensor nodes.

As shown in FIG. 1B, the write_0 operational diagram 100B of the memory circuitry 100 shows a signal path flow of logic_1 on the first bitline BL through at least one bitcell 108 to a logic_0 on the second bitline NBL. In this instance, transistor T1 receives the GWEN signal in a logic_0 state, which deactivates transistor T1, and thus, transistor T2 is ON by activation signal (logic_1) via the first bitline (BL) at node (n1). Also, transistor T3 receives the GWEN signal in a logic_0 state, which activates transistor T3 (ON), and transistor T4 receives the NGWEN signal in a logic_1 state, which activates transistor T4 (ON). In MRAM, the second bitline may be referred to as a source line (SL).

As shown in FIG. 1C, the write_1 operational diagram 100C of the memory circuitry 100 shows a signal path flow of logic_0 on the first bitline BL through at least one bitcell 108 to a logic_1 on the second bitline NBL. In this instance, transistor T1 receives the GWEN signal in a logic_0 state, which deactivates transistor T1, and thus, transistor T2 is OFF by activation signal (logic_0) via the first bitline BL at node (n1). Also, transistor T3 receives the GWEN signal in a logic_0 state, which activates transistor T3 (ON), and transistor T4 receives the NGWEN signal in a logic_1 state, which activates transistor T4 (ON). In MRAM, the second bitline may be referred to as a source line (SL).

As shown in FIG. 1D, the read operational diagram 100D of the memory circuitry 100 shows the transmission gate (T3, T4) as deactivated (OFF). For instance, transistor T3 receives the GWEN signal in a logic_1 state, which deactivates transistor T3 (OFF), and transistor T4 receives the NGWEN signal in a logic_0 state, which deactivates transistor T4 (OFF). In this instance, transistor T1 receives the GWEN signal in a logic_1 state, which activates transistor T1, which passes ground to the first bitline BL, and thus, transistor T2 is OFF by the grounded signal (logic_0) via the first bitline BL at node (n1). In SRAM, the bitlines may refer to complementary bitlines (BL, NBL), and in MRAM, the bitlines may refer to a bitline (BL) and a source line (SL).

Figure 2A:
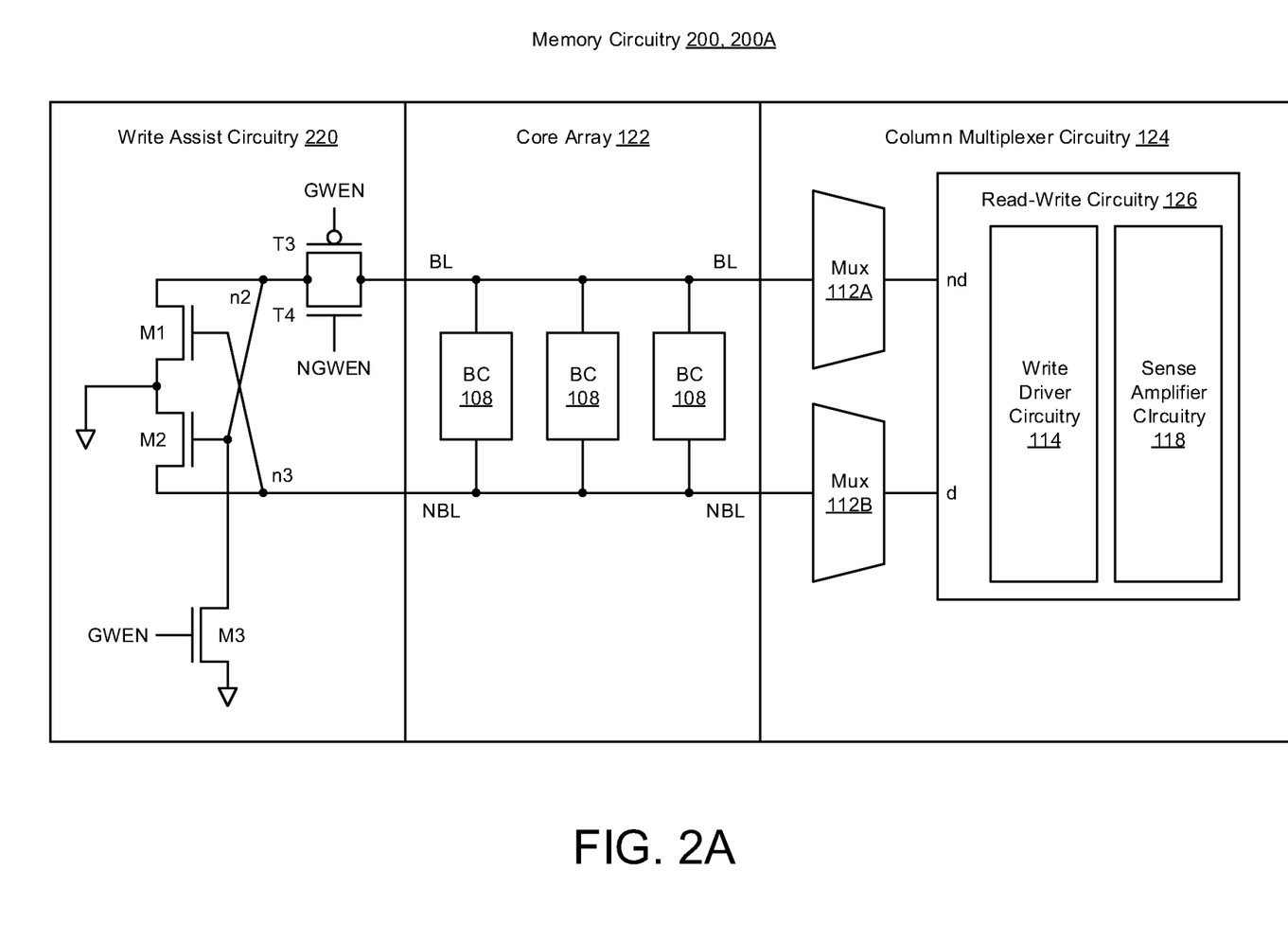
FIGS. 2A-2D illustrate memory circuitry that uses other write assist schemes and techniques in accordance with implementations described herein.
Figure 2B:
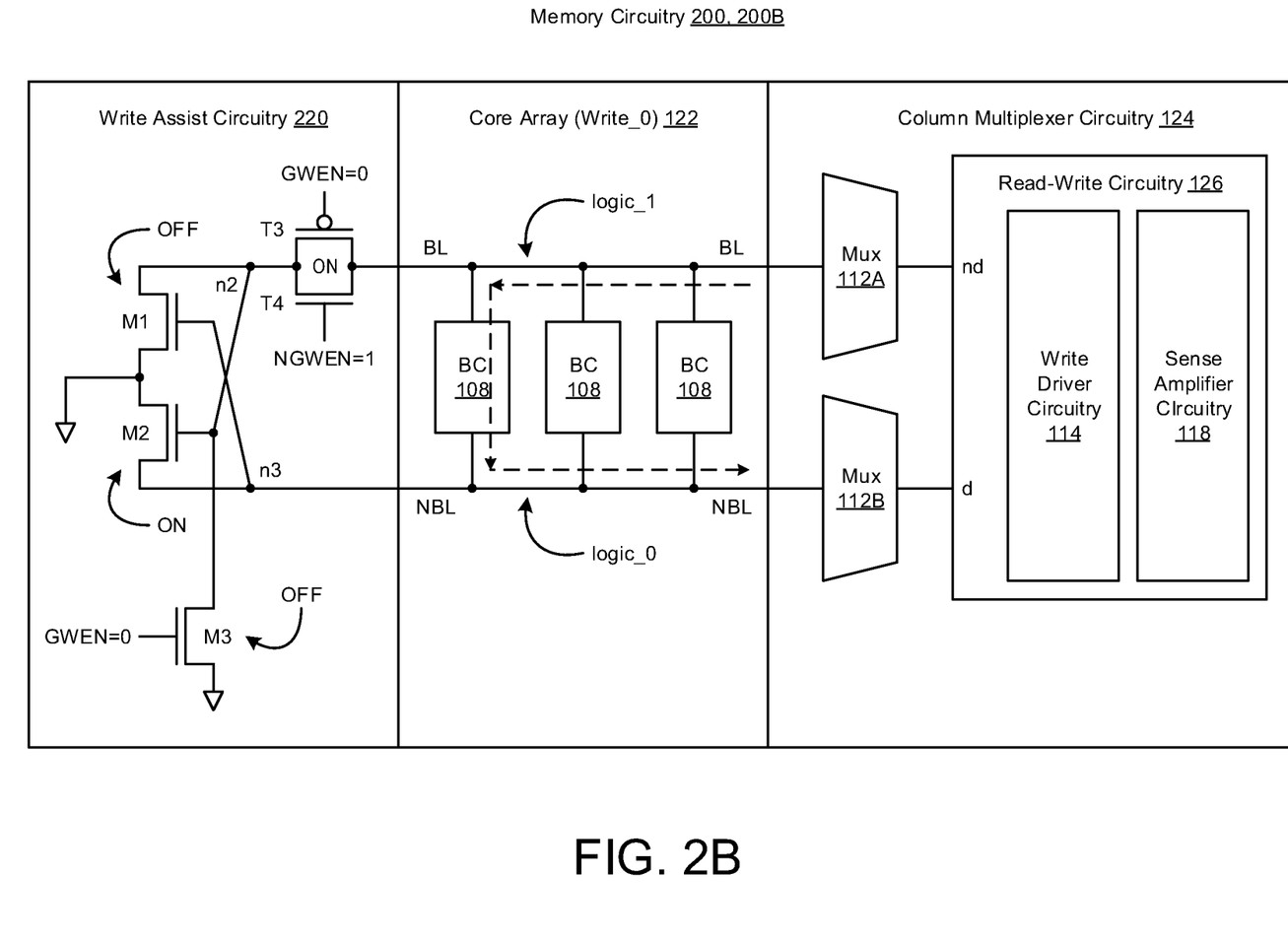
Figure 2C:
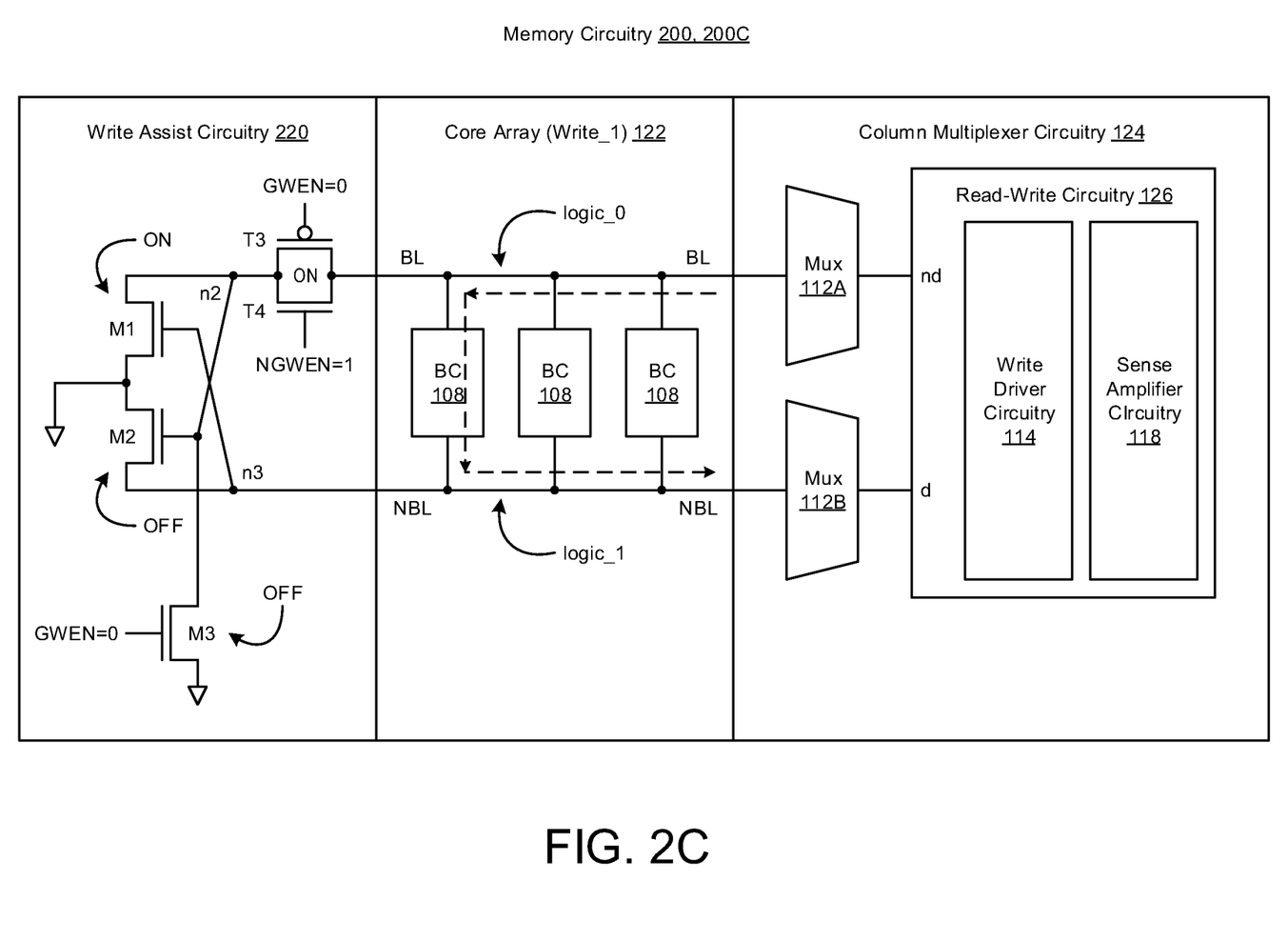
Figure 2D:
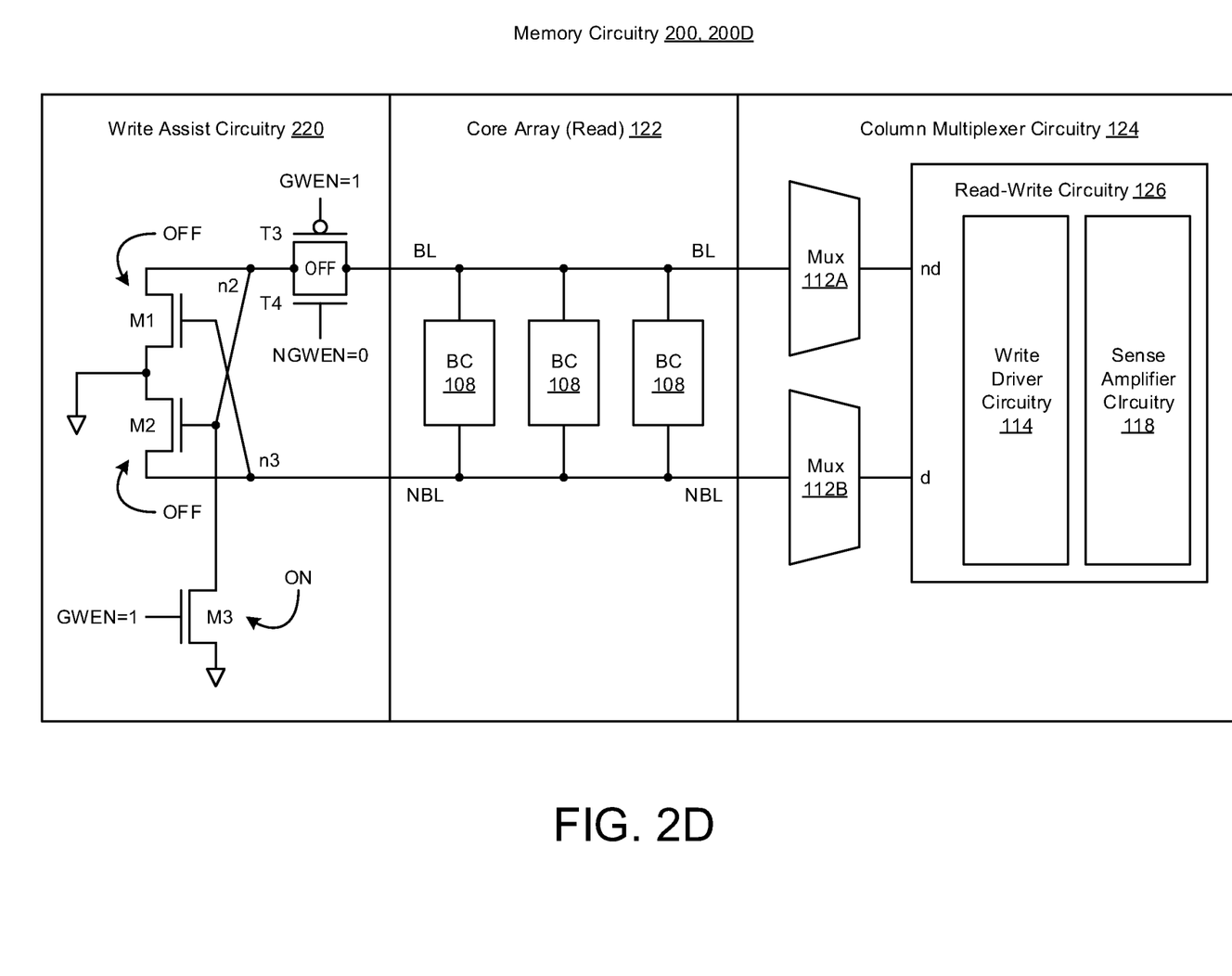

FIGS. 2A-2D illustrate memory circuitry 100 that utilizes write assist schemes and techniques in accordance with some implementations described herein. In particular, FIG. 2A shows a configurational diagram 200A of the memory circuitry 200, FIG. 2B shows a write_0 operational diagram 200B of the memory circuitry 200, FIG. 2C shows a write_1 operational diagram 200C of the memory circuitry 200, and FIG. 2D shows a read operational diagram 200D of the memory circuitry 200.

In some instances, the memory circuitry 200 may be implemented as a system or device having various circuit components that are arranged and/or coupled together as an assemblage or some combination of parts that provide for a physical layout design and related structures. Also, in some instances, a method of designing, providing and building the memory circuitry 200 may involve use of various circuit components described herein so as to implement write assist schemes and techniques associated therewith.

As shown in FIG. 2A, the memory circuitry 200 may include various circuitry, such as, e.g., write assist circuitry 220, the core array 122 of bitcells 108, and the column multiplexer circuitry 124. In some instances, the write assist circuitry 220 may include various circuit components, such as, e.g., multiple passgates M1-M3 and T3-T4, that are coupled to one or more bitlines (BL, NBL). Also, the column multiplexer circuitry 124 may include various circuit components, such as, e.g., the multiplexers 112A, 112B and the read-write circuitry 126, that are coupled to the bitlines (BL, NBL). The read-write circuitry 126 may include the write driver circuitry 114 and the sense amplifier circuitry 118. In SRAM, the bitlines may refer to complementary bitlines (BL, NBL), and in MRAM, the bitlines may refer to a bitline (BL) and a source line (SL).

The write assist circuitry 220 may include the passgates M1, M2, M3, T3, T4 that are coupled to the bitcells 108 via the bitlines (BL, NBL). The passgates may include a first passgate M1 coupled to the bitcells 108 via a first bitline BL and a second passgate M2 coupled to the bitcells 108 via a second bitline NBL. In some instances, a gate of the first passgate M1 may be coupled to the second bitline NBL, and a gate of the second passgate M2 may be coupled to the first bitline BL, wherein the gates of the passgates (M1, M2) are cross-coupled to the bitlines (BL, NBL). The passgates may also include a third passgate M3 that is coupled between the gate of the second passgate M2 and ground e.g., Vss or Gnd), and a gate of the third passgate M3 may receive the global write enable (GWEN) signal. The first passgate M1 may be a first N-type transistor, the second passgate M2 may be a second N-type transistor, and also, the third passgate M3 may be a third N-type transistor. However, the first passgate M1, the second passgate M2, and/or the third passgate M3 may be implemented with a P-type transistor.

The write assist circuitry 120 may include the transmission gate (T3, T4) that is coupled to the first bitline BL between the first passgate M1 and the bitcells 108 in the core array 122, and the gate of the second passgate M2 may be coupled between the transmission gate (T3, T4) and the first passgate M1. The transmission gate (T3, T4) may include the third passgate T3 (e.g., a P-type transistor) and the fourth transistor T4 (e.g., an N-type transistor). In some instances, a gate of the third passgate T3 may receive the first global write enable signal (e.g., GWEN), and the gate of the fourth passgate T4 may receive a second global write enable signal (e.g., NGWEN) that is complementary to the first global write enable signal (e.g., GWEN). Also, the third passgate T3 may be a P-type transistor, and the fourth passgate T4 may be a third N-type transistor. However, in other configurations, the third passgate T3 may be implemented with an N-type transistor, and the fourth passgate T4 may be implemented with an N-type transistor.

The memory circuitry 200 may be implemented as an integrated circuit (IC) in various types of memory, such as, e.g., random access memory (RAM), including static RAM (SRAM), magneto-resistive RAM (MRAM), and/or any similar memory. The memory circuitry 200 may also be implemented as an IC with single-port memory architecture and related circuitry. The memory circuitry 200 may also be integrated with computing circuitry and related components on a single chip. The memory circuitry 200 may be implemented in various embedded systems for various electronic, mobile and Internet-of-things (IoT) applications, including low power sensor nodes.

As shown in FIG. 2B, the write_0 operational diagram 200B of the memory circuitry 200 shows a signal path flow of logic_1 on the first bitline BL through at least one bitcell 108 to a logic_0 on the second bitline NBL. In this instance, transistor M1 receives the logic_0 signal from the second bitline NBL via node (n3), which deactivates transistor M1 (OFF), and also, transistor M2 receives the logic_1 signal from the first bitline via node (n2), which activates transistor M2 (ON). Also, in this instance, transistor M3 receives the GWEN signal in a logic_0 state, which deactivates transistor M3 (OFF) and blocks the first bitline signal from going to ground. In the transmission gate (T3, T4), transistor T3 receives the GWEN signal in a logic_0 state, which deactivates transistor T3 (ON), and transistor T4 receives the NGWEN signal in a logic_1 state, which activates transistor T4 (ON). In MRAM, the second bitline may be referred to as a source line (SL).

As shown in FIG. 2C, the write_1 operational diagram 200C of the memory circuitry 200 shows a signal path flow of logic_0 on the first bitline BL through at least one bitcell 108 to a logic_1 on the second bitline NBL. In this instance, transistor M1 receives the logic_1 signal from the second bitline NBL via node (n3), which activates transistor M1 (ON), and also, transistor M2 receives the logic_0 signal from the first bitline via node (n2), which deactivates transistor M2 (OFF). Also, in this instance, transistor M3 receives the GWEN signal in a logic_0 state, which deactivates transistor M3 (OFF) and blocks the first bitline signal from going to ground. In the transmission gate (T3, T4), transistor T3 receives the GWEN signal in a logic_0 state, which deactivates transistor T3 (ON), and transistor T4 receives the NGWEN signal in a logic_1 state, which activates transistor T4 (ON). In MRAM, the second bitline may be referred to as a source line (SL).

As shown in FIG. 2D, the read operational diagram 200D of the memory circuitry 200 shows the transmission gate (T3, T4) as deactivated (OFF). For instance, in the transmission gate (T3, T4), transistor T3 receives the GWEN signal in a logic_1 state, which deactivates transistor T3 (OFF), and transistor T4 receives the NGWEN signal in a logic_0 state, which deactivates transistor T4 (OFF). Also, in this instance, transistor M1 is OFF, transistor M2 is OFF, and transistor M3 is ON. In addition, as shown in FIG. 2D, transistor M3 receives the GWEN signal in a logic_1 state, which activates transistor M3 (ON), which coupled the gate of transistor M2 to ground (e.g., Vss or Gnd). In SRAM, the bitlines may refer to complementary bitlines (BL, NBL), and in MRAM, the bitlines may refer to a bitline (BL) and a source line (SL).

Figure 3:
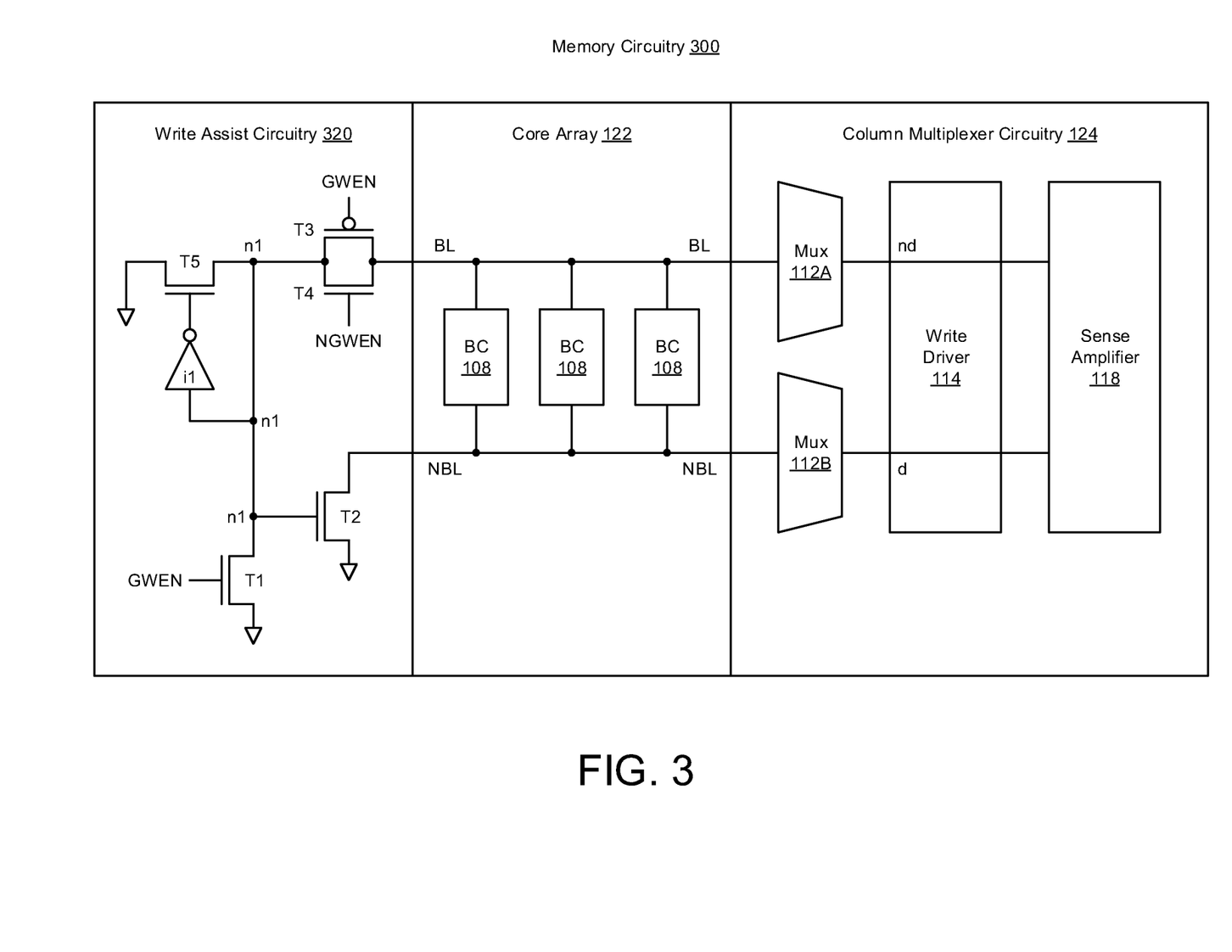
FIG. 3 illustrates memory circuitry that uses other write assist schemes and techniques in accordance with implementations described herein.

FIG. 3 illustrates memory circuitry 300 that uses other write assist schemes and techniques in accordance with implementations described herein. In particular, the memory circuitry 300 of FIG. 3 is similar to the memory circuitry 100 of FIG. 1, except for addition of a fifth passgate T5 and inverter (i1) coupled to the first bitline BL.

As shown in FIG. 3, the memory circuitry 300 may include various circuitry, such as, e.g., write assist circuitry 320, the core array 122 of bitcells 108, and the column multiplexer circuitry 124. In some instances, the write assist circuitry 220 may include various circuit components, such as, e.g., multiple passgates T1-T5, that are coupled to one or more bitlines (BL, NBL). Also, the column multiplexer circuitry 124 may include various circuit components, such as, e.g., the multiplexers 112A, 112B and the read-write circuitry 126, that are coupled to the bitlines (BL, NBL). The read-write circuitry 126 may include the write driver circuitry 114 and the sense amplifier circuitry 118. In SRAM, the bitlines may refer to complementary bitlines (BL, NBL), and in MRAM, the bitlines may refer to a bitline (BL) and a source line (SL).

The write assist circuitry 220 may include the passgates M1, M2, M3, M4 along with passgate M5 that are coupled to the bitcells 108 via the bitlines (BL, NBL). As shown, the passgates may include the passgate T1 coupled to the bitcells 108 via the bitline BL and the passgate T2 coupled to the bitcells 108 via the bitline NBL. The gate of passgate T1 may be coupled to the bitline NBL, and the gate of the passgate T2 may be coupled to the bitline BL. The passgate T5 may be coupled to the first bitline (BL) between the first passgate (T1) and ground (e.g., Vss or Gnd), and the inverter (i1) may be coupled between the first bitline (BL) and a gate of the passgate T5. The passgate T1 may be an N-type transistor, the passgate T2 may be an N-type transistor, and the passgate T5 may be an N-type transistor. Also, the passgate T3 may be a P-type transistor, and passgate T4 may be an N-type transistor. However, in some configurations, one or more passgates T1, T2, T5 may be implemented with a P-type transistor.

Figure 4:
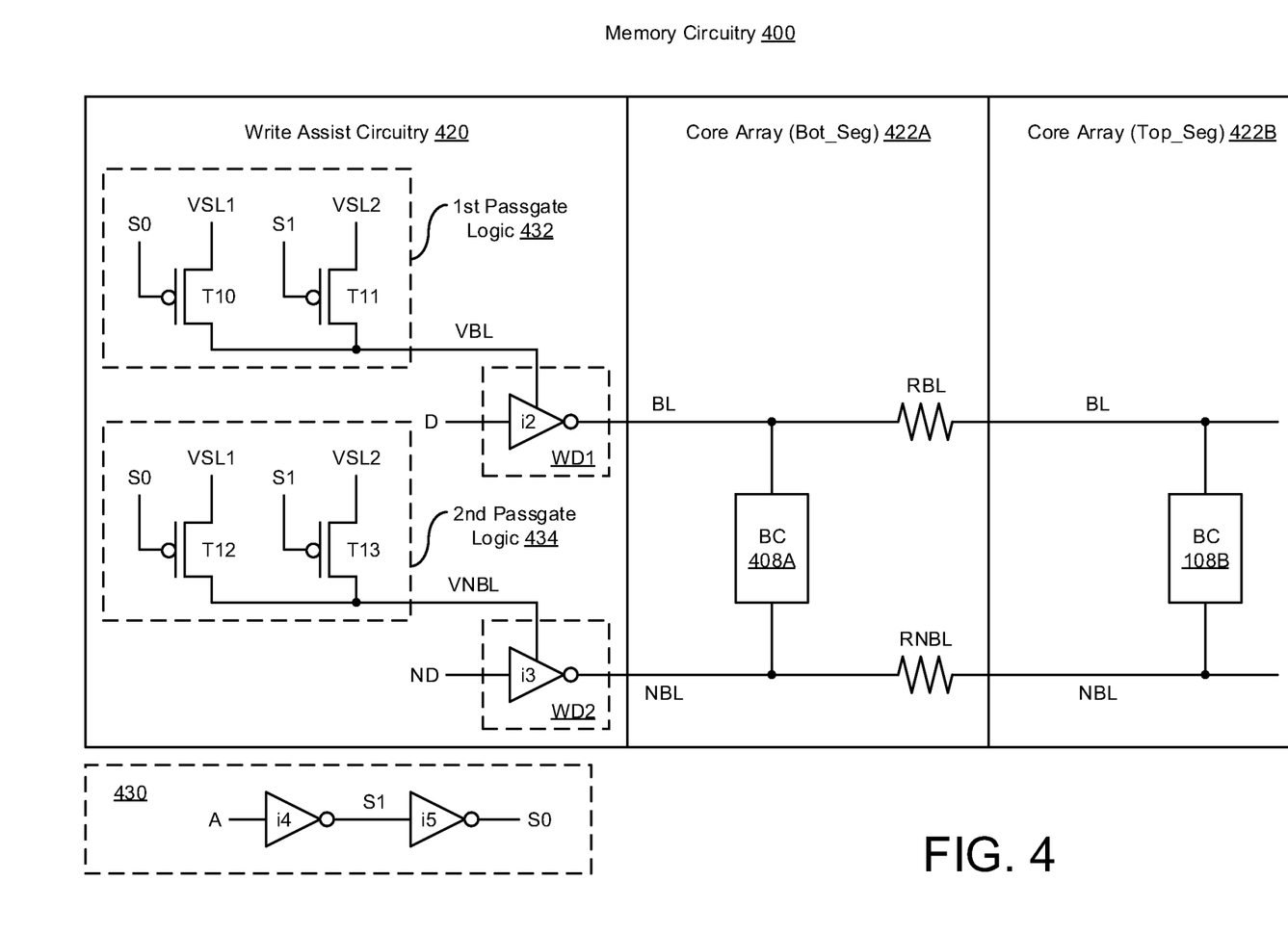
FIG. 4 illustrates other memory circuitry that uses write assist schemes and techniques in accordance with implementations described herein.

FIG. 4 illustrates other memory circuitry 400 that uses write assist schemes and techniques in accordance with various implementations described herein.

In some instances, the memory circuitry 400 may be implemented as a system or device having various circuit components that are arranged and/or coupled together as an assemblage or some combination of parts that provide for a physical layout design and related structures. Also, in some instances, a method of designing, providing and building the memory circuitry 400 may involve use of various circuit components described herein so as to implement write assist schemes and techniques associated therewith.

As shown in FIG. 4, the memory circuitry 400 may include various circuitry, such as, e.g., write assist circuitry 420, a first core array 422A of first bitcells (BC) 408A, and a second core array 422B of second bitcells (BC) 408B. In some instances, the write assist circuitry 420 may include various circuit components, such as, e.g., passgate logic 432, 434 and write drivers (WD1, WD2), that are coupled to one or more bitlines (BL, NBL). In some instances, the memory circuitry 400 may include clock circuitry 430 that receives an address signal (A), e.g., as an input clock pulse, and provides one or more selection signals (S0, S1), e.g., as one or more output clock pulses. In some instances, the clock circuitry 430 may include multiple series-coupled inverters (i4, i5). In SRAM, the bitlines may refer to complementary bitlines (BL, NBL), and in MRAM, the bitlines may refer to a bitline (BL) and a source line (SL).

The memory circuitry 400 may be implemented with one or more core arrays 422A, 422B in various multi-bank configurations, wherein each bank may have an array of memory cells or bitcells. For instance, the core arrays 422A, 422B may include a first bank 422A or bottom segment (Bot_Seg), and the core arrays 422A, 422B may include a second bank 422B or top segment (Top_Seg). It should be appreciated that reference to top and/or bottom may be relative to the positional orientation of the memory circuitry 400, and reference to top and/or bottom may be referred to as upper and/or lower. In various instances, the bitlines (BL, NBL) may have resistive factors associated therewith, wherein, e.g., the bitline BL may have a resistance coefficient factor RBL, and also, the other bitline NBL may have another resistance coefficient factor RNBL.

In some instances, each bitcell may be configured to store at least one data bit value (e.g., a data value related to a logical '0' or '1'). The one or more core arrays 422A, 422B include any number of bitcells arranged in various configurations, such as, e.g., two-dimensional (2D) memory arrays having any number of columns and any number of rows of multiple bitcells, which may be arranged in a 2D grid pattern for read and write memory access. Each bitcell may be implemented with any type of memory, including, e.g., static random access memory (SRAM), magneto-resistive RAM (MRAM), and/or any other type of similar memory. Also, each bitcell may include a multi-transistor static RAM (SRAM) cell, including various types of SRAM cells, such as, e.g., any type of complementary MOS (CMOS) SRAM cells, such as, e.g., 4T, 6T, 8T, 10T, or more transistors per bit. In other instances, each bitcell may include a multi-layer MRAM bitcell having free-layers and pinned layers. In SRAM, the bitlines may refer to complementary bitlines (BL, NBL), and in MRAM, the bitlines may refer to a bitline (BL) and a source line (SL).

The write assist circuitry 420 may include passgate logic circuitry, such as, e.g., first passgate logic 432 and second passgate logic 434. The first passgate logic 432 may include one or more transistors (e.g., T10, T11) that are coupled in parallel to a power supply input of a write driver (e.g., WD1). The second passgate logic 434 may include one or more transistors (e.g., T12, T13) that are also coupled in parallel to a power supply input of another write driver (e.g., WD2). The first passgate logic 432 may provide a first voltage (VBL) to the power supply input of the write driver WD1, and the second passgate logic 434 may provide a second voltage (VNBL) to the power supply input of the other write driver WD2. In some configurations, transistors T10, T11, T12, T13 may be parallel-coupled P-type transistors. However, in other configurations, transistors T10, T11, T12, T13 may be parallel-coupled N-type transistors.

In some implementations, the write assist circuitry 420 may include one or more write drivers (WD1, WD2) that are coupled to the bitcells 408A, 408B via the bitlines (BL, NBL) including, e.g., a first write driver WD1 coupled to the bitcells 408A, 408B via a first bitline BL and a second write driver WD2 coupled to the bitcells 408A, 408B via a second bitline NBL that is complementary to the first bitline BL. In reference to MRAM, the second bitline may refer to a source line (SL). Also, the write assist circuitry 420 may include the first passgate logic 432 coupled to a first power supply input of the first write driver WD1, and the write assist circuitry 420 may include the second passgate logic 434 coupled to a second power supply input of the second write driver WD2. The write drivers (WD1, WD2) may be implemented with inverters (i2, i3). The first write driver WD1 may receive a data signal (D) and provide an output signal to the bitline BL based on the power supply input, and the second write driver WD2 may receive a complementary data signal (ND) and provide an output signal to the bitline NBL based on the power supply input.

In some instances, the first passgate logic 432 may include a first transistor T10 coupled between a first voltage source supply VSL1 and the first power supply input of the first write driver WD1. The first passgate logic 423A may include a second transistor T11 coupled in parallel with the first transistor T10 between a second voltage source supply VSL2 and the first power supply input of the first write driver WD1. Also, the second passgate logic 434 may include a third transistor T12 coupled between the first voltage source supply VSL1 and the second power supply input of the second write driver WD2. The second passgate logic 434 may include a fourth transistor T13 coupled in parallel with the third transistor T12 between the second voltage source supply VSL2 and the second power supply input of the second write driver WD2. Also, the first voltage source supply VSL1 may be similar to or different than the second voltage source supply VSL2, and in some instances, each of the core arrays 422A, 422B may be segmented and/or accessed separately and independently to save power.

In some instances, the gate of the first transistor T10 and the gate of the third transistor T12 may receive a first selection signal S0 from the clock circuitry 430, and the gate of the second transistor T11 and the gate of the fourth transistor T13 may receive a second selection signal S1 that is complementary to the first selection signal S0. Thus, in reference to the first passgate logic 432, the first transistor T10 may provide the first voltage source supply VSL1 to the first power supply input of the first write driver WD1 when the first transistor T10 is activated by the first selection signal S0, and the second transistor T11 may provide the second voltage source supply VSL2 to the first power supply input of the first write driver WD1 when the second transistor T11 is activated by the second selection signal S1. In reference to the second passgate logic 434, the third transistor T12 may provide the first voltage source supply VSL1 to the second power supply input of the second write driver WD2 when the third transistor T12 is activated by the first selection signal S0, and the fourth transistor T13 may provide the second voltage source supply VSL2 to the second power supply input of the second write driver WD2 when the fourth transistor T13 is activated by the second selection signal S1.

In some instances, the first voltage source supply (VSL1) is associated with the first part of the core array (Bot_Seg) 422A, and the first voltage source supply (VSL1) is selected by the first passgate logic 432 when any bitcell (BC) 408A in the first part of the core array (Bot_Seg) 422A is accessed. The second voltage source supply (VSL2) is associated with the second part of the core array (Top_Seg) 422B, and the second voltage source supply (VSL2) is selected by the second passgate logic 434 when any bitcell (BC) 408B in the second part of the core array (Top_Seg) 422B is accessed. In this instance, VSL1 may be associated with the first half of the core array 422A (e.g., when accessing Bot_Seg of the core array 422A), and VSL1 may be selected when any bitcell (BC) 408A is selected from the bottom portion of the core array 422A. Also, VSL2 may be associated with the second half of the core array 422B (e.g., when accessing Top_Seg of the core array 422B), and VSL2 may be selected when any bitcell (BC) 408B is selected from the top portion of the core array 422A.

The memory circuitry 400 may be implemented as an integrated circuit (IC) in various types of memory, such as, e.g., random access memory (RAM), including static RAM (SRAM), magneto-resistive RAM (MRAM), and/or any similar memory. The memory circuitry 400 may also be implemented as an IC with single-port memory architecture and related circuitry. The memory circuitry 400 may also be integrated with computing circuitry and related components on a single chip. The memory circuitry 400 may be implemented in various embedded systems for various electronic, mobile and Internet-of-things (IoT) applications, including low power sensor nodes.

Figure 5A:
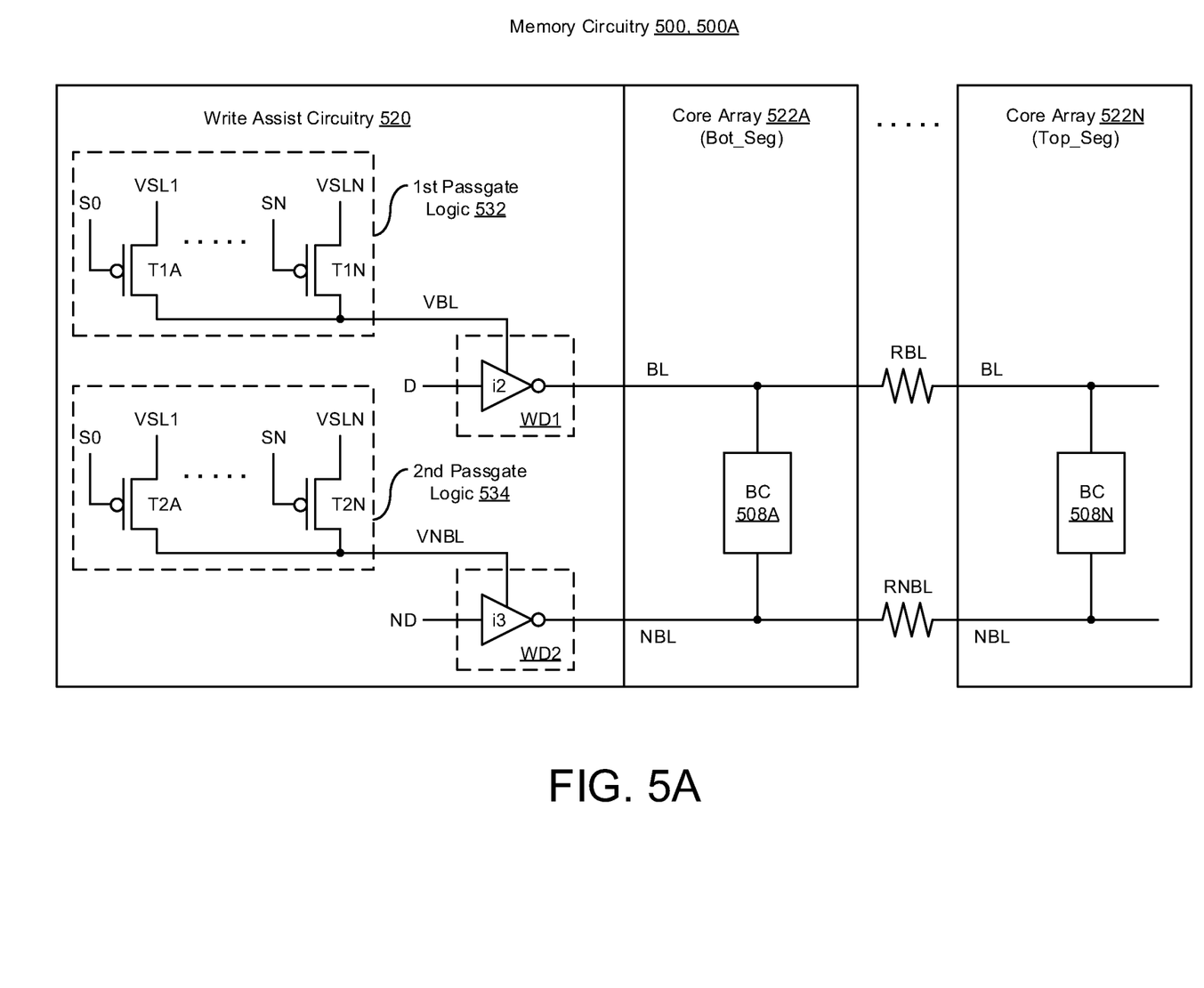
FIGS. 5A-5B illustrate other memory circuitry that uses write assist schemes and techniques in accordance with implementations described herein.
Figure 5B:
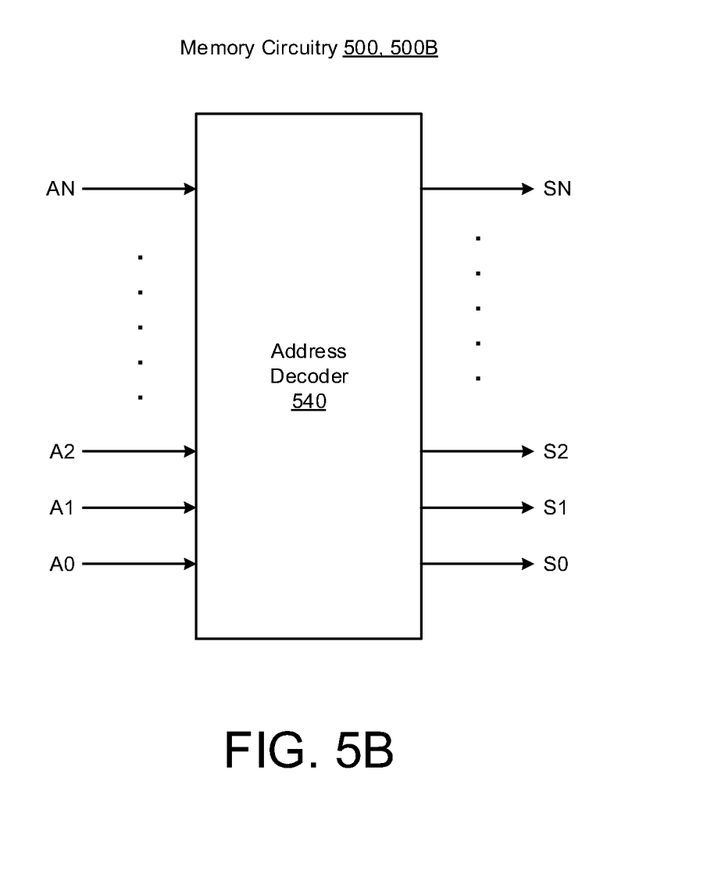

FIGS. 5A-5B illustrate other memory circuitry 500 that may utilize write assist schemes and techniques in accordance with some implementations described herein. In particular, FIG. 5A shows a configurational diagram 500A of the memory circuitry 500, FIG. 5B shows a configurational diagram 500B of address decoder 540.

In some instances, the memory circuitry 500 may be implemented as a system or device having various circuit components that are arranged and/or coupled together as an assemblage or some combination of parts that provide for a physical layout design and related structures. Also, in some instances, a method of designing, providing and building the memory circuitry 500 may involve use of various circuit components described herein so as to implement write assist schemes and techniques associated therewith.

As shown in FIG. 5A, the memory circuitry 500 may include various circuitry, such as, e.g., write assist circuitry 520 coupled to a number (N) of core arrays (e.g., 522A . . . 522N). In some instances, the write assist circuitry 520 may also include various circuit components, such as, e.g., passgate logic 532, 534 and write drivers (WD1, WD2), that are coupled to one or more bitlines (BL, NBL). In some instances, as shown in FIG. 5B, the memory circuitry 500 may utilize the address decoder 540 to receive a number (N) of address signals (e.g., A0, A1, A2, . . . , AN) as input clock pulses and provide a number (N) of selection signals (e.g., S0, S1, S2, . . . , SN) as output clock pulses that correspond to the input clock pulses. In SRAM, the bitlines may refer to complementary bitlines (BL, NBL), and in MRAM, the bitlines may refer to a bitline (BL) and a source line (SL).

The memory circuitry 500 may be implemented with multiple core arrays (e.g., 522A, . . . , 522N) in various multi-bank configurations, wherein each bank may have an array of memory cells or bitcells (e.g., 508A, . . . , 508N). For instance, the core arrays 522A, . . . , 522N may begin with a lower bank 422A or bottom segment (Bot_Seg) and the conclude with an upper bank 522N or top segment (Top_Seg). It should be appreciated that reference to top and/or bottom may be relative to positional orientation of the memory circuitry 500. Also, in some instances, the bitlines may have resistance factors associated therewith, wherein, e.g., the bitline BL may have a resistance coefficient factor RBL, and also, the other bitline NBL may have another resistance coefficient factor RNBL.

In some instances, each bitcell may be configured to store at least one data bit value (e.g., a data value related to a logical '0' or '1'). The one or more core arrays 522A, . . . , 522B include any number of bitcells arranged in various configurations, such as, e.g., two-dimensional (2D) memory arrays having any number of columns and any number of rows of multiple bitcells, which may be arranged in a 2D grid pattern for read and write memory access. Each bitcell may be implemented with any type of memory, including, e.g., SRAM, MRAM, and/or any other type of similar memory. Also, in some instances, each bitcell may include a multi-transistor static RAM (SRAM) cell, including various types of SRAM cells, such as, e.g., any type of complementary MOS (CMOS) SRAM cells, such as, e.g., 4T, 6T, 8T, 10T, or more transistors per bit. In other instances, each bitcell may include a multi-layer MRAM bitcell having free-layers and pinned layers. In SRAM, the bitlines may refer to complementary bitlines (BL, NBL), and in MRAM, the bitlines may refer to a bitline (BL) and a source line (SL).

The write assist circuitry 520 may include passgate logic circuitry, such as, e.g., first passgate logic 532 and second passgate logic 534. The first passgate logic 532 may include a number (N) of transistors (e.g., T1A, . . . , T1N) that are coupled in parallel to a power supply input of the write driver (e.g., WD1). The second passgate logic 534 may include a number (N) of transistors (e.g., T2A, . . . , T2N) that are also coupled in parallel to a power supply input of the other write driver (e.g., WD2). In some configurations, the transistors (T1A, . . . , T1N and T2A, . . . , T2N) may be parallel-coupled P-type transistors. However, in other configurations, the transistors (T1A, . . . , T1N and T2A, . . . , T2N) may be parallel-coupled N-type transistors. Also, in some instances, the first passgate logic 532 may provide the first voltage (VBL) to the power supply input of the write driver WD1, and the second passgate logic 534 may provide the second voltage (VNBL) to the power supply input of the other write driver WD2.

In some implementations, the write assist circuitry 520 may include one or more write drivers (WD1, WD2) that are coupled to the bitcells 508A, 508B via the bitlines (BL, NBL) including, e.g., a first write driver WD1 coupled to the bitcells 508A, 508B via a first bitline BL and a second write driver WD2 coupled to the bitcells 508A, 508B via a second bitline NBL that is complementary to the first bitline BL. In reference to MRAM, the second bitline may refer to a source line (SL). Also, the write assist circuitry 520 may include the first passgate logic 532 coupled to the first power supply input of the first write driver WD1, and the write assist circuitry 520 may include the second passgate logic 434 coupled to the second power supply input of the second write driver WD2. The write drivers (WD1, WD2) may be implemented with inverters (i2, i3). The first write driver WD1 may receive a data signal (D) and provide an output signal to the bitline BL based on the power supply input, and the second write driver WD2 may receive a complementary data signal (ND) and provide an output signal to the bitline NBL based on the power supply input.

In some instances, the first passgate logic 532 may include a first number (N) of transistors (T1A, . . . , T1N) that are coupled in parallel between a number (N) of voltage source supplies (VSL1, . . . , VSLN) and the first power supply input of the first write driver WD1. The second passgate logic 534 may include a second number (N) of transistors (T2A, . . . , T2N) that are coupled in parallel between the number (N) of voltage source supplies (VSL1, . . . , VSLN) and the second power supply input of the second write driver WD2. In some instances, each voltage source supply of the number (N) of voltage source supplies (VSL1, . . . , VSLN) may be similar to or different than each other voltage source supply of the number (N) of voltage source supplies (VSL1, . . . , VSLN). Also, in various instances, each of the core arrays (522A, . . . , 522N) may be segmented and/or accessed separately and independently to save power.

In various instances, gates of each first transistor (T1A, . . . , T1N) and gates of each second transistor (T2A, . . . , T2N) may receive corresponding selection signals (S0, . . . , SN) from the address decoder 540. Thus, in reference to the first passgate logic 532, each first transistor (T1A, . . . , T1N) may provide a corresponding voltage source supply (VSL1, . . . , VSLN) to the first power supply input of the first write driver WD1, when each first transistor (T1A, . . . , T1N) is activated by its corresponding selection signal (S0, . . . , SN). Also, in reference to the second passgate logic 534, each second transistor (T2A, . . . , T2N) may provide a corresponding voltage source supply (VSL1, . . . , VSLN) to the second power supply input of the second write driver WD2, when each second transistor (T2A, . . . , T2N) is activated by its corresponding selection signal (S0, . . . , SN).

The memory circuitry 500 may be implemented as an integrated circuit (IC) in various types of memory, such as, e.g., random access memory (RAM), including static RAM (SRAM), magneto-resistive RAM (MRAM), and/or any similar memory. The memory circuitry 500 may also be implemented as an IC with single-port memory architecture and related circuitry. The memory circuitry 500 may also be integrated with computing circuitry and related components on a single chip. The memory circuitry 500 may be implemented in various embedded systems for various electronic, mobile and Internet-of-things (IoT) applications, including low power sensor nodes.

As shown in FIG. 5B, the memory circuitry 500 may include address decoder circuitry 540 that receives the number (N) of address signals (A0, A1, A2, . . . , AN) and provides the number (N) of selection signals (S0, S1, S2, . . . , SN) that corresponds to the number of address signals (A0, A1, A2, . . . , AN). In some instances, the address decoder circuitry 540 may provide the number (N) of selection signals (S0, S1, S2, . . . , SN) to the first power supply input of the first write driver WD1, and the address decoder circuitry 540 may also provide the number (N) of selection signals (S0, S1, S2, . . . , SN) to the second power supply input of the second write driver WD2.

In some instances, in reference to FIGS. 5A-5B, each voltage source supply of the number (N) of voltage source supplies (VSL1, . . . , VSLN) may be associated with a corresponding segment (522A, . . . , 522N) of bitcells (BC: 508A, . . . , 508N) in the core array. Also, each voltage source supply (VSL1, . . . , VSLN) may be selected by the first passgate logic 532 or the second passgate logic 534 when any bitcell in the corresponding segment (522A, . . . , 522N) of bitcells is accessed. For instance, VSL1 may be associated with a first segment 522A of the core array (e.g., when accessing the first segment 522A of the core array), and VSL1 may be selected when any bitcell (BC) 508A is selected from the first segment 522A of the core array. VSL2 may be associated with a second segment 522B of the core array (e.g., when accessing the second segment 522B of the core array), and VSL2 may be selected when any bitcell (BC) 508B is selected from the second segment 522B of the core array. Lastly, VSLN may be associated with an Nth segment 522N of the core array (e.g., when accessing the Nth segment 522N of the core array), and VSLN may be selected when any bitcell (BC) 508N is selected from the Nth segment 522N of the core array. Similar associations may be made for numbers C-N.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but may be referred to as a routine undertaking of design, fabrication, and manufacture for those of ordinary skill in the art having benefit of this disclosure.

Described herein are various implementations of a device. The device may include memory circuitry having a core array of bitcells. The device may include write assist circuitry having passgates coupled to the bitcells via bitlines. The passgates may include a first passgate coupled to the bitcells via a first bitline and a second passgate coupled to the bitcells via a second bitline, and a gate of the second passgate may be coupled to the first bitline.

Described herein are various implementations of a device. The device may include memory circuitry having a core array of bitcells. The device may include write assist circuitry having passgates coupled to the bitcells via bitlines. The passgates may include a first passgate coupled to the bitcells via a first bitline and a second passgate coupled to the bitcells via a second bitline. In some instances, a gate of the first passgate may be coupled to the second bitline, and a gate of the second passgate may be coupled to the first bitline.

Described herein are various implementations of a device. The device may include memory circuitry having a core array of bitcells. The device may include write assist circuitry having write drivers coupled to the bitcells via bitlines including a first write driver coupled to the bitcells via a first bitline and a second write driver coupled to the bitcells via a second bitline that is complementary to the first bitline. The write assist circuitry may include first passgate logic coupled to a first power supply input of the first write driver, and the write assist circuitry may include second passgate logic coupled to a second power supply input of the second write driver.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   memory circuitry having a core array of bitcells; and
   write assist circuitry having passgates coupled to the bitcells via bitlines including a first passgate coupled to the bitcells via a first bitline and a second passgate coupled to the bitcells via a second bitline,
   wherein a gate of the second passgate is coupled to the first bitline.

2. The device of claim 1, wherein a gate of the first passgate receives a global write enable (GWEN) signal or a write controlled clock.

3. The device of claim 1, wherein the first passgate comprises a first N-type transistor, and wherein the second passgate comprises a second N-type transistor.

4. The device of claim 1, further comprising:
   a transmission gate coupled to the first bitline between the first passgate and the bitcells in the core array, wherein the gate of the second passgate is coupled between the transmission gate and the first passgate.

5. The device of claim 4, wherein the transmission gate comprises a P-type transistor and an N-type transistor, wherein a gate of the P-type transistor receives a first global write enable signal, and wherein a gate of the N-type transistor receives a second global write enable signal that is complementary to the first global write enable signal.

6. The device of claim 1, wherein the passgates include a third passgate coupled to the first bitline between the first passgate and ground, and wherein an inverter is coupled between the first bitline and a gate of the third passgate.

7. The device of claim 1, further comprising:
   column multiplexer circuitry having multiplexers and read-write circuitry with write driver circuitry and sense amplifier circuitry coupled to the bitlines,
   wherein the multiplexers include a first multiplexer coupled to the bitcells via the first bitline between the bitcells and the read-write circuitry,
   wherein the multiplexers include a second multiplexer coupled to the bitcells via the second bitline between the bitcells and the read-write circuitry.

8. The device of claim 1, wherein the bitcells comprise static random access memory (SRAM) bitcells, and wherein the second bitline is complementary to the first bitline.

9. The device of claim 1, wherein the bitcells comprise magneto-resistive random access memory (MRAM) bitcells, and wherein the second bitline refers to a source line.

10. A device, comprising:
    memory circuitry having a core array of bitcells; and
    write assist circuitry having passgates coupled to the bitcells via bitlines including a first passgate coupled to the bitcells via a first bitline and a second passgate coupled to the bitcells via a second bitline,
    wherein a gate of the first passgate is coupled to the second bitline, and
    wherein a gate of the second passgate is coupled to the first bitline.

11. The device of claim 10, wherein the passgates include a third passgate coupled between the gate of the second passgate and ground, and wherein a gate of the third passgate receives a global write enable signal.

12. The device of claim 11, wherein the first passgate, the second passgate, and the third passgate comprise N-type transistors.

13. The device of claim 10, further comprising:
    a transmission gate coupled to the first bitline between the first passgate and the bitcells in the core array, wherein the transmission gate comprises a P-type transistor and an N-type transistor, wherein a gate of the P-type transistor receives a first global write enable signal, and wherein a gate of the N-type transistor receives a second global write enable signal that is complementary to the first global write enable signal.

* * * * *